United States Patent
Huang et al.

(10) Patent No.: US 6,583,499 B2
(45) Date of Patent: Jun. 24, 2003

(54) QUAD FLAT NON-LEADED PACKAGE AND LEADFRAME FOR USE IN A QUAD FLAT NON-LEADED PACKAGE

(75) Inventors: Chien-Ping Huang, Hsinchu Hsien (TW); Tzong-Dar Her, Taichung (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 8 days.

(21) Appl. No.: 09/861,757

(22) Filed: May 21, 2001

(65) Prior Publication Data
US 2002/0063315 A1 May 30, 2002

(30) Foreign Application Priority Data
Nov. 30, 2000 (TW) ........................... 89125445 A

(51) Int. Cl.[7] ............................................. H01L 23/495
(52) U.S. Cl. ................... 257/666; 257/669; 257/676
(58) Field of Search ................. 257/666, 669, 257/674, 676, 786

(56) References Cited

U.S. PATENT DOCUMENTS

| | | | | |
|---|---|---|---|---|
| 4,048,438 A | * | 9/1977 | Zimmerman | 174/68.5 |
| 5,250,840 A | * | 10/1993 | Oh et al. | 257/666 |
| 5,623,162 A | * | 4/1997 | Kurihara | 257/666 |
| 5,712,507 A | * | 1/1998 | Eguchi et al. | 257/666 |
| 5,874,773 A | * | 2/1999 | Terada et al. | 257/676 |
| 5,920,116 A | * | 7/1999 | Umehara et al. | 257/669 |
| 6,225,685 B1 | * | 5/2001 | Newman et al. | 257/666 |
| 6,255,742 B1 | * | 7/2001 | Inaba | 257/796 |

FOREIGN PATENT DOCUMENTS

| | | | | |
|---|---|---|---|---|
| JP | 02001077266 | * | 9/1999 | H01L/23/50 |
| JP | 02001127090 | * | 10/1999 | H01L/21/56 |
| JP | 2002036270 | * | 7/2000 | B29C/43/18 |

OTHER PUBLICATIONS

Shirai et al. The Technology for over 300–pin QFP's, May 1992, IEEE, 423–428.*

* cited by examiner

Primary Examiner—Amir Zarabian
Assistant Examiner—Monica Lewis

(57) ABSTRACT

A quad flat non-leaded package comprises: a die pad having a first upper surface and a corresponding first lower surface thereon a plurality of interlacing slots are formed, each of the interlacing slots extending to the edges of the die pad to form a plurality of island-like blocks; a plurality of leads disposed at the periphery of the die pad, wherein each of the leads has respectively a second upper surface and a corresponding second lower surface coplanar to the surface of the island-like blocks; a chip having an active surface and a corresponding back surface adhered onto the first upper surface of the die pad; and a molding compound encapsulating the chip, the second upper surface, the first upper surface and the interlacing slots while exposing the surface of the island-like blocks and the second lower surface of the leads.

17 Claims, 3 Drawing Sheets

US 6,583,499 B2

QUAD FLAT NON-LEADED PACKAGE AND LEADFRAME FOR USE IN A QUAD FLAT NON-LEADED PACKAGE

CROSS RELATED APPLICATION

This application claims the benefit priority of Taiwan application serial No. 89125445, filed Nov. 30, 2001.

BACKGROUND OF THE INVENTION

1. Field of the Invention

The invention relates to a quad flat non-leaded package. More particularly, the invention relates to the bonding structure of a quad flat non-leaded package.

2. Description of the Related Art

As the era of information technology progresses, the transmission and processing of information and documents are increasingly performed via sophisticated electronic products. Accompanying the progress of technology, many commercial products with more convenient features have been promoted, such as mobile phones, computers, audio-video articles, etc. In such a context, various high-density packaging structures thus are manufactured, such as chip scale packages (CSP), multi-chip modules (MCM), etc.

Among these various packaging structures, the quad flat non-leaded package (QFN) has been developed by the Matsusita company. The quad flat non-leaded package (QFN) usually is a leadframe-based chip scale package (CSP). Advantageously, the conductor traces of the non-leaded chip scale package (CSP) are short, which reduces the deterioration of the transmitted signal. Such a packaging structure is conventionally used to package low pin count semiconductor elements.

FIG. 1 shows a conventional quad flat non-leaded package (QFN) structure. The conventional quad flat non-leaded package 100 comprises a chip 110, a leadframe 130, and a molding compound 160. The chip 110 has an active surface 112 and a corresponding back surface 114, wherein the active surface 112 of the chip 110 comprises a plurality of bonding pads 116. The leadframe 130 comprises a die pad 140 and a plurality of leads 150, wherein the die pad 140 has an upper surface 142 and a corresponding lower surface 144, and each of the leads also has an upper surface 152 and a corresponding lower surface 154. Within the package structure, the chip 110 is adhered by the back surface 114 thereof to the upper surface 142 of the die pad 140 and, through the bonding wires 170, the bonding pads 116 are respectively connected to the leads 150. The molding compound 160 encapsulates the chip 110, the bonding wires 170, the upper surfaces 152 of the leads 150, and the upper surface 142 of die pad 140 while exposing the lower surfaces 154 of the leads 150 and the lower surface 144 of the die pad 140.

The quad flat non-leaded package (QFN) 100 is further mounted upon a printed circuit board 180 that has a plurality of contact nodes 182 and a ground contact node 184 located at the center of the contact nodes 182. Via a reflow process, bonding materials 192 and 194 respectively connect the lower surface 154 of the leads 150 to the contact nodes 182 and the lower surface 144 of the die pad 140 to the ground contact node 184 of the printed circuit board 180.

FIG. 1A shows an upward view of the quad flat non-leaded package of FIG. 1 in which the die pad and the leads are exposed through the molding compound. In the conventional quad flat non-leaded package (QFN) 100, the lower surface 144 of the die pad 140 is square-shaped and is substantially large. As a result, when the bonding material 194 underneath the die pad 140 is reflowed, the generated surface tension on the bonding material 194 causes the die pad 140 to drift above the ground contact node 184. The deviation of the position of the die pad may cause an inaccurate connection of the leads 150 to the contact nodes 182 of the printed circuit board 180 and therefore decrease the quality of the electrical connections.

SUMMARY OF THE INVENTION

An aspect of the invention is to provide a quad flat non-leaded package and a leadframe structure for a quad flat non-leaded package in which the quality of the electrical bonding between the quad flat non-leaded package (QFN) and the printed circuit board is improved.

Another aspect of the invention is to provide a quad flat non-leaded package and a leadframe structure for a quad flat non-leaded package wherein the leads of the quad flat non-leaded package (QFN) can be accurately connected to the contact nodes of the printed circuit board.

To attain the foregoing and other objectives, the present invention provides a quad flat non-leaded package (QFN) that, according to a preferred embodiment, comprises: a die pad having a first upper surface and a corresponding first lower surface, wherein the first lower surface of the die pad has a plurality of interlacing slots, each of the interlacing slots uniformly extending to the edges of the lower surface of the die pad to define a plurality of island-like blocks; a plurality of leads disposed at the periphery of the die pad, wherein each of the leads respectively has a second upper surface and a corresponding second lower surface substantially coplanar with the surface of the island-like blocks; a chip having an active surface with a plurality of bonding pads thereon respectively connected to the leads and a corresponding back surface adhered onto the first upper surface of the die pad; and a molding compound encapsulating the chip, the second upper surfaces of the leads, and the first upper surface of the die pad while exposing the surface of the island-like blocks and the second lower surfaces of the leads.

To attain the above and other objectives, the invention further provides a quad flat non-leaded package (QFN) suitable to be arranged on a printed circuit board, the printed circuit board comprising a plurality of contact nodes and a ground contact node disposed at the center of the contact nodes. The quad flat non-leaded package (QFN) suitable to be arranged on the printed circuit board, according to another embodiment of the present invention, comprises: a die pad having a first upper surface and a corresponding first lower surface, wherein the first lower surface of the die pad has a plurality of interlacing slots, each of the interlacing slots respectively extending to the edges of the lower surface of the die pad, thereby forming a plurality of island-like blocks; a plurality of leads disposed at the periphery of the die pad, wherein each of the leads respectively has a second upper surface and a corresponding second lower surface substantially coplanar with the surface of the island-like blocks; a chip having an active surface with a plurality of bonding pads thereon respectively connected to the leads and a corresponding back surface adhered onto the first upper surface of the die pad; and a molding compound encapsulating the chip, the second upper surface of the plurality of leads, and the first upper surface of the die pad while exposing the surface of the island-like blocks and the second lower surfaces of the leads. The second lower surface of each of the leads is respectively connected to the contact nodes of the printed circuit board through a plurality first bonding materials, while the islands-like blocks are respectively connected to the ground contact node through a plurality of second bonding materials to provide electric and heat dissipation paths.

To attain the above and other objectives, the invention further provides a leadframe suitable for use in a quad flat non-leaded package (QFN). The leadframe, according to another embodiment of the present invention, comprises: a die pad having a first upper surface and a corresponding first lower surface, wherein the first lower surface of the die pad has a plurality of interlacing slots, each of the interlacing slots extending uniformly to the edges of the lower surface of the die pad to form a plurality of island-like blocks; and a plurality of leads disposed at the periphery of the die pad, wherein each of the leads respectively has a second upper surface and a corresponding second lower surface substantially coplanar to the surface of the island-like blocks.

In an example of the present invention, the die pad is substantially square and the island-like blocks are arranged in a matrix with the slots respectively parallel to an edge of the die pad. In another example of the present invention, the island-like blocks can be arranged in a matrix with the slots respectively secant at an angle to an edge of the die pad. The surface of the island-like blocks can be rounded.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Hereinafter embodiments of the present invention will be explained concretely with reference to the accompanied drawings.

Figure 1:
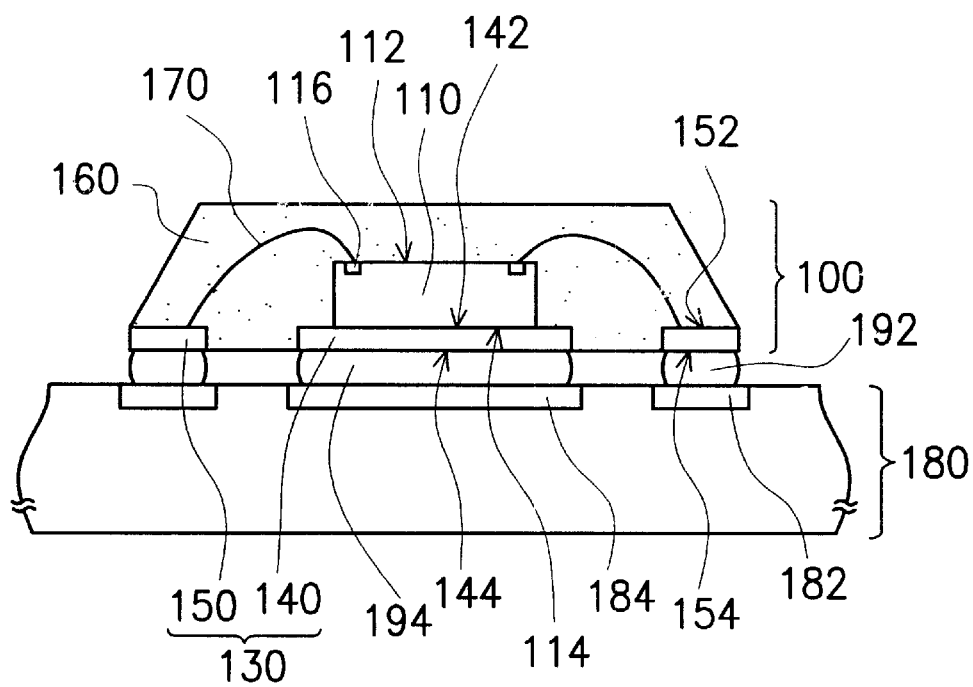
FIG. 1 is a schematic view of a conventional quad flat non-leaded package (QFN)
Figure 1A:
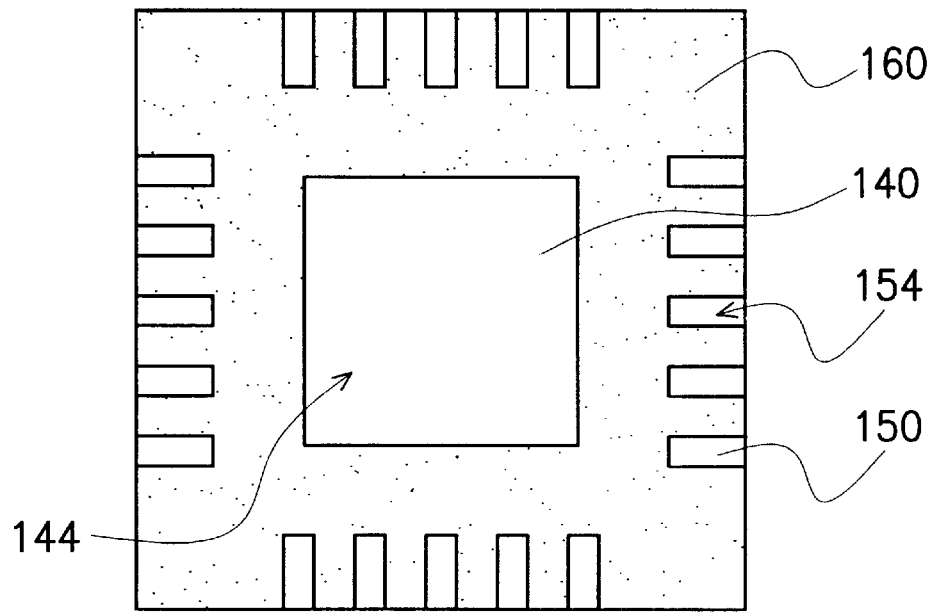
FIG. 1A is a schematic upward view of the quad flat non-leaded package (QFN) of FIG. 1.
Figure 2:
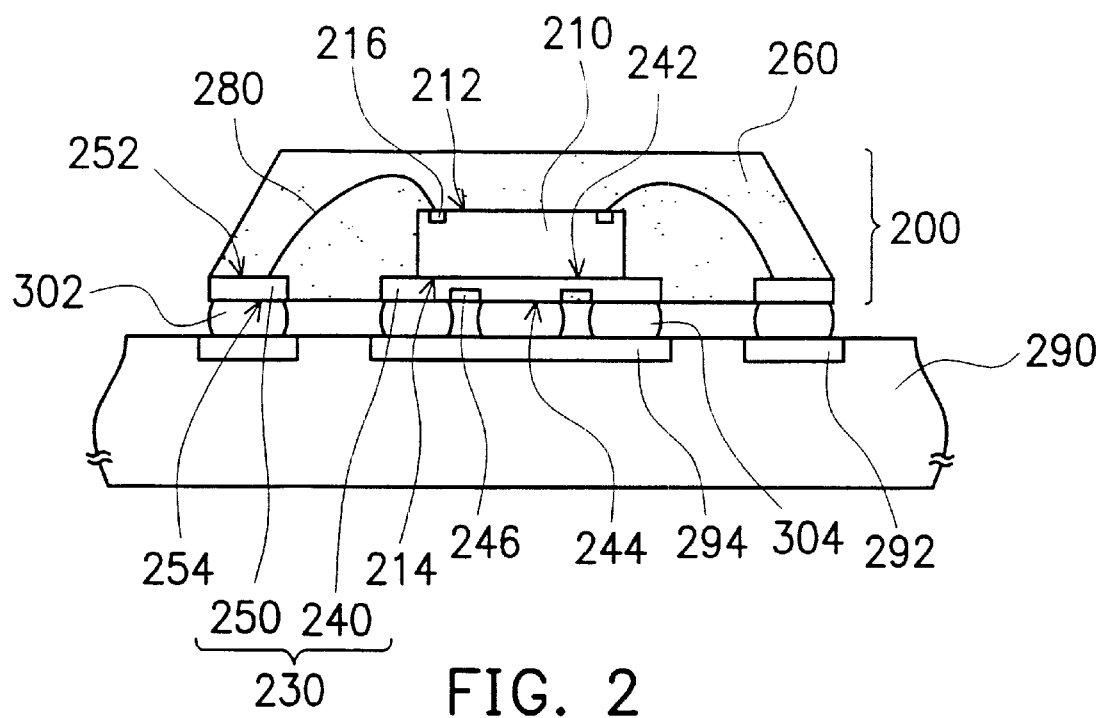
FIG. 2 is a schematic cross-sectional view of a quad flat non-leaded package (QFN) according to a preferred embodiment of the invention.
Figure 2A:
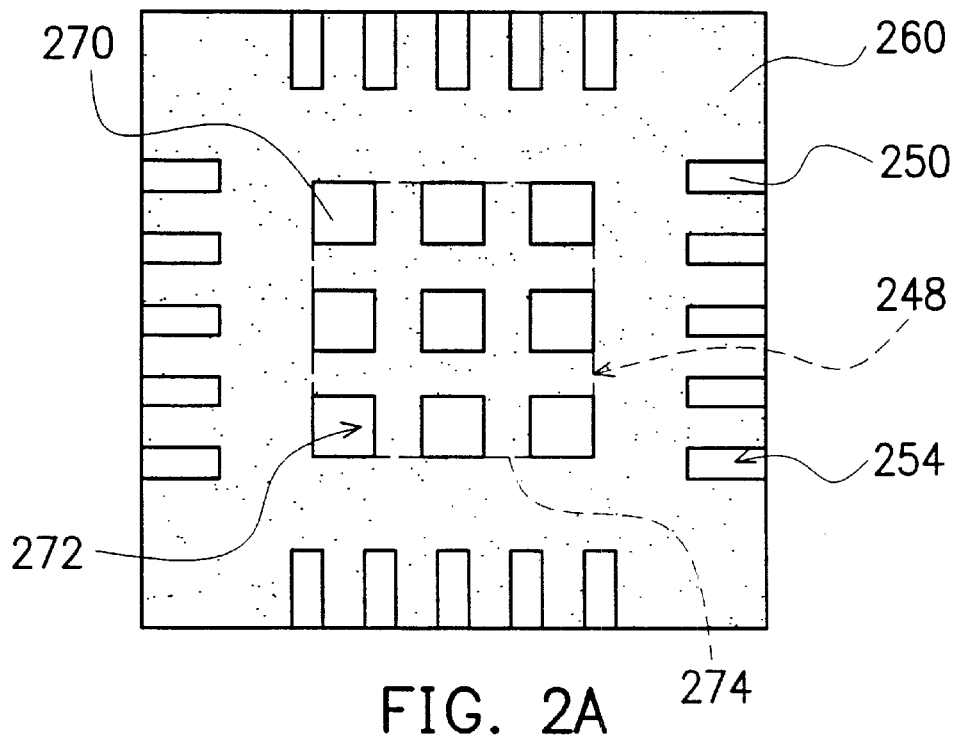
FIG. 2A is a schematic bottom view of the quad flat non-leaded package (QFN) of FIG. 2 according to a preferred embodiment of the present invention.

FIG. 2 is a cross-sectional view of the quad flat non-leaded package (QFN) according to a first preferred embodiment of the invention, while FIG. 2A is a schematic upward view of the quad flat non-leaded package of FIG. 2. Referring to both FIG. 2 and FIG. 2A, the quad flat non-leaded package 200 comprises a chip 210, a leadframe 230, and a molding compound 260. The leadframe 230 comprises a die pad 240 and a plurality of leads 250. The die pad 240 has a first upper surface 242 and a corresponding first lower surface 244.

As shown in FIG. 2A, a plurality of slots 246 interlace on and uniformly extend to the edges 248 of the first lower surface 244 of the die pad 240 to form a plurality of island-like blocks 270. The die pad 240 is, for example, substantially square and the island-like blocks 270 are arranged in a matrix with the slots 246 respectively parallel to an edge of the die pad 240.

In FIG. 2A, the dash lines 274 show the dimensional profile of the chip 210 arranged on the die pad 240. The leads 250, respectively having a second upper surface 252 and a corresponding second lower surface 254, are disposed at the periphery of the die pad 240. A surface 272 of each of the island-like blocks 270 is substantially coplanar to the second lower surface 254 of each of the leads 250. The chip 210 has an active surface 212 and a corresponding back surface 214 adhered onto the first upper surface 242 of the die pad 240. The active surface 212 of the chip 210 has a plurality of bonding pads 216 that are respectively connected to the leads through a plurality of bonding wires 280. The molding compound 260 encapsulates the chip 210, the second upper surface 252 of the leads 250, the first upper surface 242 of the die pad 240, and the slots 246 while exposing the surface 272 of the island-like blocks 270 and the second lower surface 254 of the leads 250.

A printed circuit board 290 is further provided. The printed circuit board 290 comprises a plurality of contact nodes 292 and a ground contact node 294 that is disposed in the center of the contact nodes 292.

During a reflow process in which the above quad flat non-leaded package (QFN) 200 is disposed on the printed circuit board 290, a plurality of first bonding materials 302 and second bonding materials 304 respectively connect the second lower surface 254 of the leads 250 onto the contact nodes 292 and the island-like blocks 270 onto the ground contact node 294 of the printed circuit board 290.

Unlike the conventional package, the contact surface between each of the respective second bonding materials 304 and each of the respective island-like blocks 270 are substantially small in the quad flat non-leaded package of the present invention. During the reflowing, all the different surface tensions with nonuniform directions generated between each of the second bonding materials 304 and each of the island-like blocks 270 thus result in a total surface tension between the entire die pad 240 and all the second bonding materials 304 that is substantially reduced. As a result, the drift between the die pad 240 and the second bonding material 304 can be substantially reduced. The bonding of the die pad 240 onto the ground contact node 294 of the printed circuit board 290 and the bonding of the leads 250 onto the contact nodes 292 of the printed circuit board 290 thus can be more ensured. Consequently, the connection between the quad flat non-leaded package (QFN) 200 and the printed circuit board 290 can be accurately performed, and the quality of the bonding thus is improved.

Figure 3:
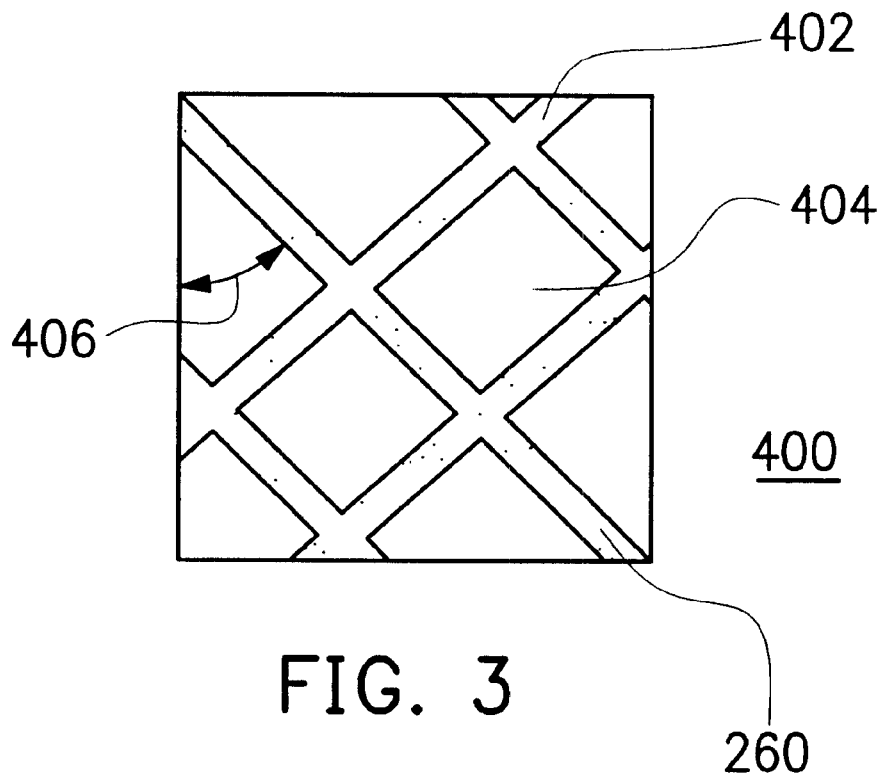
FIG. 3 is an enlarged view of the first lower surface of the die pad of the quad flat non-leaded package (QFN) of FIG. 2 according to an example of the present invention.

FIG. 3 is an enlarged view of the first lower surface of the die pad in another example of the present invention. The slots are not restricted to be parallel to an edge of the die pad 240 such as in the above-described embodiment of the present invention. The slots 402 are arranged at an angle, for example an angle 406, with respect to an edge of the die pad 400, as shown in FIG. 3. In this manner, the island-like blocks 404 are formed in matrix.

Figure 4:
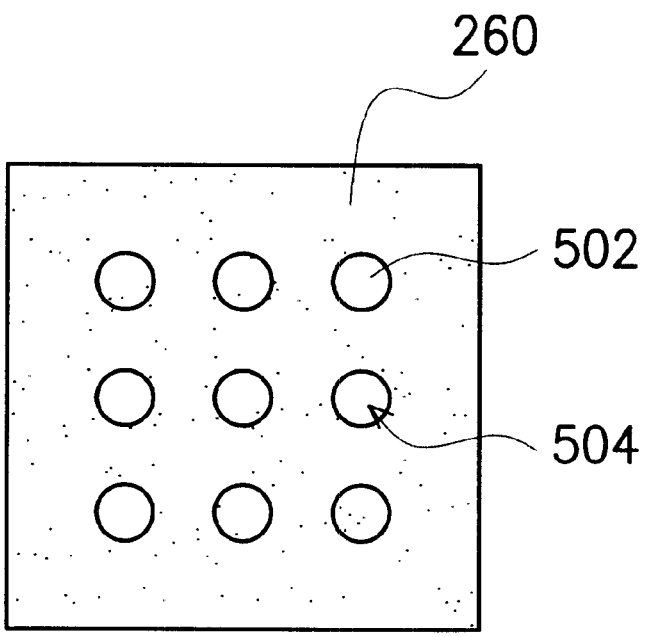
FIG. 4 is an enlarged view of the first lower surface of the die pad of the quad flat non-leaded package (QFN) of FIG. 2 according to another example of the present invention.

FIG. 4 is an enlarged view of the first lower surface of the die pad according to another example of the present invention in which the surface 504 of the island-like blocks 502 can be rounded.

In accordance with the foregoing description, the invention has at least the following advantages. The quad flat non-leaded package (QFN) and the leadframe structure for the quad flat non-leaded package (QFN) can reduce the drift effect between the die pad and the bonding materials. As a result, the quality of the bonding and the accuracy of the connections of the quad flat non-leaded package (QFN) onto the printed circuit board are advantageously improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A quad flat non-leaded package comprising:
    a die pad having a first upper surface and a corresponding first lower surface, wherein a plurality of interlacing slots crossing each other are provided on the first lower surface, and wherein each of the interlacing slots uniformly extends from one edge of the first lower surface to another edge thereof to define a plurality of blocks;
    a plurality of leads disposed at the periphery of the die pad, each of the leads having respectively a second upper surface and a corresponding second lower surface;
    a chip having an active surface and a corresponding back surface, wherein the active surface is provided with a plurality of bonding pads respectively connected the leads, and the back surface of the chip is adhered onto the first upper surface of the die pad; and
    a molding compound encapsulating the chip, the second upper surface of the leads, the first upper surface of the die pad, and the interlacing slots while exposing the blocks on the first lower surface of the die pad and the second lower surface of the leads.

2. The quad flat non-leaded package of claim 1, wherein the die pad is substantially square and the interlacing slots are respectively parallel to an edge of the die pad.

3. The quad flat non-leaded package of claim 1, wherein the die pad is substantially square and the interlacing slots are respectively extended from an edge of the die pad to one of its adjacent edges.

4. The quad flat non-leaded package of claim 1, wherein the surface of each of the blocks is rounded.

5. The quad flat non-leaded package of claim 1, wherein the bonding pads are respectively connected to the leads through a plurality of bonding wires.

6. A quad flat non-leaded package arranged on a printed circuit board, the printed circuit board comprising a plurality of contact nodes and a ground contact node disposed at the center of the contact nodes, the quad flat non-leaded package comprising:
    a die pad having a first upper surface and a corresponding first lower surface, wherein a plurality of interlacing slots crossing each other are provided on the first lower surface, and wherein each of the interlacing slots uniformly extends from one edge of the first lower surface to another edge thereof to define a plurality of blocks;
    a plurality of leads disposed at the periphery of the die pad, each of the leads having respectively a second upper surface and a corresponding second lower surface;
    a chip having an active surface and a corresponding back surface, wherein the active surface is provided with a plurality of bonding pads respectively connected the leads, and the back surface of the chip is adhered onto the first upper surface of the die pad; and
    a molding compound encapsulating the chip, the second upper surface of the leads, the first upper surface of the die pad, and the interlacing slots while exposing the surface of the blocks and the second lower surface of the leads,
    wherein the second lower surface of each of the leads is respectively connected to the contact nodes of the printed circuit board through a plurality of first bonding materials, and the blocks are respectively connected to the ground contact nodes through a plurality of second bonding materials to provide electrical and heat conductive paths.

7. The quad flat non-leaded package of claim 6, wherein the die pad is substantially square and the interlacing slots are arranged respectively parallel to an edge of the die pad.

8. The quad flat non-leaded package of claim 6, wherein the die pad is substantially square and the interlacing slots are respectively extended from an edge of the die pad to one of its adjacent edges.

9. The quad flat non-leaded package of claim 6, wherein the surface of each of the blocks is rounded.

10. The quad flat non-leaded package of claim 6, wherein the bonding pads are respectively connected to the leads through a plurality of bonding wires.

11. A leadframe suitable for use in a quad flat non-leaded package, the leadframe comprising:
    a die pad having a first upper surface and a corresponding first lower surface comprising a plurality of interlacing slots, wherein each of the interlacing slots uniformly from one edge of the first lower surface to another edge thereof to define a plurality of blocks; and
    a plurality of leads disposed at the periphery of the die pad, each of the plurality of leads having respectively a second upper surface and a corresponding second lower surface.

12. The leadframe of claim 11, wherein the die pad is substantially square and the interlacing slots are arranged respectively parallel to an edge of the die pad.

13. The leadframe of claim 11, wherein the die pad is substantially square and the interlacing slots are respectively extended from an edge of the die pad to one of its adjacent edges.

14. The leadframe of claim 11, wherein the surface of each of the blocks is rounded.

15. The quad flat non-leaded package of claim 1, wherein the interlacing slots are not open to the first upper surface of the die pad.

16. The quad flat non-leaded package of claim 6, wherein the interlacing slots are not open to the first upper surface of the die pad.

17. The leadframe of claim 11, wherein the interlacing slots are not open to the first upper surface of the die pad.

* * * * *